US006924158B2

(12) United States Patent
Syms

(10) Patent No.: US 6,924,158 B2
(45) Date of Patent: Aug. 2, 2005

(54) ELECTRODE STRUCTURES

(75) Inventor: Richard Syms, London (GB)

(73) Assignee: Microsaic Systems Limited, London (GB)

( * ) Notice: Subject to any disclaimer, the term of this patent is extended or adjusted under 35 U.S.C. 154(b) by 273 days.

(21) Appl. No.: 10/242,908

(22) Filed: Sep. 13, 2002

(65) Prior Publication Data

US 2003/0049899 A1 Mar. 13, 2003

(30) Foreign Application Priority Data

Sep. 13, 2001 (GB) ............................................ 0122161

(51) Int. Cl.[7] ............................................... H01L 21/00
(52) U.S. Cl. ............................. 438/20; 438/22; 257/79
(58) Field of Search .............................. 438/10–11, 20, 438/22, 28–30, 978, 34, 800; 257/10–11, 49, 340; 216/13, 38, 58, 80; 445/50, 24; 313/309–310, 351, 512, 336; 315/334–337, 351

(56) References Cited

U.S. PATENT DOCUMENTS 3,665,241 A 5/1972 Spindt et al.
4,013,465 A * 3/1977 Clapham et al. .............. 430/11
4,943,343 A 7/1990 Bardai et al.
4,964,946 A 10/1990 Gray et al.
5,214,347 A 5/1993 Gray et al.
5,228,877 A 7/1993 Allaway et al.
5,266,155 A 11/1993 Gray
5,266,530 A 11/1993 Bagley et al.
5,457,355 A * 10/1995 Fleming et al. ............. 313/336
5,584,740 A 12/1996 Hsu et al.
5,679,610 A * 10/1997 Matsuda et al. ............ 438/584
5,742,121 A 4/1998 Hsu et al.
5,769,679 A 6/1998 Park et al.
5,789,272 A * 8/1998 Wang et al. .................. 438/20
5,814,931 A * 9/1998 Makishima ................. 313/441
5,909,033 A * 6/1999 Koga et al. .................. 257/10
6,008,064 A 12/1999 Busta
6,022,256 A * 2/2000 Rolfson ....................... 445/24
6,043,103 A * 3/2000 Takemura .................... 438/20
6,084,245 A 7/2000 Hsu et al.
6,084,337 A * 7/2000 Beardmore ................. 313/292
6,168,491 B1 1/2001 Hsu et al.
6,201,342 B1 * 3/2001 Hobart et al. ............... 313/309
6,246,069 B1 6/2001 Hsu et al.
6,572,425 B2 * 6/2003 Maxim et al. ................ 445/24
6,617,773 B1 * 9/2003 Yamamoto et al. ......... 313/310
6,756,730 B2 * 6/2004 Russ et al. .................. 313/496

FOREIGN PATENT DOCUMENTS

JP 2000-100557 * 4/2000 ........... H05B/33/02

OTHER PUBLICATIONS

Busta et al., "Fabrication of Gated SiC Vertical Edge Emitters by Chemical Mechanical Polishing," *J. Micromech. Microeng.*, 7:37–43 (1997).

(Continued)

*Primary Examiner*—Long Pham
*Assistant Examiner*—Thao X. Le
(74) *Attorney, Agent, or Firm*—Marshall, Gerstein & Borun LLP

(57) ABSTRACT

A method of forming vertical knife-edge cold-cathode field emission electron sources with self-aligned gate electrodes and sub-micron electrode separations. The method exploits the enhancement of ion-beam erosion rates obtained in metals at oblique ion incidence, which allows the preferential removal of a metal layer at the convex edge of a mesa 2 to create a well-defined separation between the horizontal and vertical surfaces of the metal. The horizontal surface may be used as the gate and the vertical surface as the cathode in a vacuum triode structure. Electrical isolation is obtained by forming the mesa 2 in an insulating layer or substrate 1. Isolation may be improved by removing the insulating material in the vicinity of the metal edges. Field-induced electron emission from the cathode may be obtained at low voltage based on the enhancement of the electric field at the sharp tip of the cathode.

19 Claims, 11 Drawing Sheets

OTHER PUBLICATIONS

Cade et al., "Vacuum Microelectronics," *GEC Journal of Research*, 7:129–138 (1990).

Chin et al., "Field Emitter Tips for Vacuum Microelectronic Devices," *J. Vac. Sci. Technol.*, A8:3586–3590 (1990).

Fleming et al., "Fabrication and Testing of Vertical Metal Edge Emitters with Well Defined Gate to Emitter Separation," *J. Vac. Sci. Technol.*, B14:1958–1962 (1996).

Fowler et al., "Electron Emission in Intense Electric Fields", *Proc. Roy Soc.*, 119:173–181 (1928).

Gamo et al., "Fabrication of Petal–Shaped Vertical Field Emitter Arrays," *Jpn. J. Apply. Phys.*, 34:6916–6921 (1995).

Gorfinkel et al., "Development of 4 in. Field–emission Displays," *J. Vac. Sci. Technol.*, B15:524–527 (1997).

Gotoh et al., "Fabrication of Lateral–Type Thin–Film Edge Film Emitters by Focused Ion Beam Technique," *J. Vac. Sci. Technol.*, B13:465–468 (1995).

Hofmann et al., "Fabrication of Integrated Micromachined Electron Guns," *J. Vac. Sci. Technol.*, B13:2701–2704 (1995).

Hoole et al., "Directly Patterned Low Voltage Planar Tungsten Lateral Field Emission Structures," *J. Vac. Sci. Technol.*, B11:2574–2578 (1993).

Hsu et al., "20nm Linewidth Platinum Pattern Fabrication Using Conformal Effusive–Source Precursor Deposition and Sidewall Lithography," *J. Vac. Sci. Technol.*, B10:2251–2258 (1992).

Hsu et al., "Vertical Thin–Film–Edge Field Emitters: Fabrication by Chemical Beam Deposition, Imaging of Cathodoluminescence and Characterization of Emission," *Thin Solid Films*, 286:92–97 (1996).

Huq et al., "Fabrication of Sub–10nm Silicon Tips: A New Approach," *J. Vac. Sci. Technol.*, B13:2718–2721 (1995).

Itoh et al., "Fabrication of Double–Gated Si Field Emitter Arrays for Focused Electron Beam Generation," *J. Vac. Sci. Technol.*, B13:1969–1972 (1995).

Itoh et al., "Development and Application of Field Emitter Arrays in Japan," *Appl. Surf. Sci.*, 111:194–203 (1997).

Johnson et al., "Characterization of Lateral–Thin––Film–Edge Field Emitter Arrays," *J. Vac. Sci. Technol.*, B15:535–538 (1997).

Jones et al., "Silicon Field Emission Transistors and Diodes," *IEEE Trans. on Comps., Hybrids and Mfg. Tech.*, 15:1051–1055 (1992).

Lee et al., "Fabrication and Characterization of Volcano–Shaped Field Emitters Surrounded by Planar Gates," *J. Vac. Sci. Technol.*, B15:464–467 (1997).

Lee et al., "Self–Aligned Silicon Tips Coated with Diamondlike Carbon," *J. Vac. Sci. Technol.*, B15:457–459 (1997).

Liu et al., "Fabrication of Wedge–Shaped Silicon Field Emitters with nm–Scale Radii," *Appl. Phys. Lett.*, 58:1042–1043 (1991).

Marcus et al., "Formation of Silicon Tips with <1 nm Radius," *Appl. Phys. Lett.*, 56:236–238 (1990).

Mellier–Smith et al., "Ion Etching for Pattern Delineation," *J. Vac. Sci. Technol.*, 13:1008–1022 (1976).

Rakhshandehroo et al., "Fabrication of Si Field Emitters by Dry Etching and Mask Erosion," *J. Vac. Sci. Technol.*, B14:612–616 (1996).

Somekh, S., "Introduction to Ion and Plasma Etching," *J. Vac. Sci. Technol.*, 13:1003–1007 (1976).

Spindt et al., "Physical Properties of Thin–Film Field Emission Cathodes with Molybdenum Cones," *J. Appl. Phys.*, 47:5248–5263 (1976).

Spindt et al., "A Thin–Film Field–Emission Cathode", *J. Appl. Phys.*, 39:3504–3505 (1968).

Utsumi, T., "Keynole Address; Vacuum Microelectronics: What's New and Exciting," *IEEE Transactions on Electron Devices*, 38:2276–2283 (1991).

Wang et al., "Electrostatic Analysis of Field Emission Triode with VOlcano–Type Gate," *J. Vac. Sci. Technol.*, 14:1938–1941 (1996).

Xu et al., "Enhancing Electron Emission from Silicon Tip Arrays by Using Thin Amorphous Diamond Coating," *Appl. Phys. Lett.*, 73:3668–? (1998).

Search Report, United Kingdom Patent Office, GB 0122161.3.

* cited by examiner

1

2

3

4

5

ELECTRODE STRUCTURES

FIELD OF THE INVENTION

The present invention relates to electrode structures, to methods of forming such structures and to electron sources made from such structures, and more particularly, concerns a method of forming vertical knife-edge cold-cathode field-emission electron sources with self-aligned gates and sub-micron electrode separations.

BACKGROUND OF THE INVENTION

Cold-cathode field emission electron sources are based on room-temperature, field-enhanced tunnelling at the apex of a sharp-tipped structure (Fowler and Nordheim 1928). The development of the first practical devices is due to Spindt (Spindt 1968; Spindt et al. 1976; U.S. Pat. No. 3,665,241). These devices were based on cylindrically symmetric sharp tips formed by etching in a material with low work function. Since then, there has been considerable further development of silicon-based Spindt emitters for applications in vacuum microelectronics (Cade et al. 1990; Jones et al. 1992), vacuum instruments (Itoh 1997), electron beam lithography (Hofmann et al. 1995) and thin-film displays (Gorfinkel et al. 1997).

FIG. 1 shows the most common geometry for a field-emission triode. Here a sharp tip etched in a conducting substrate acts as the cathode or electron emitter. A planar conductive layer spaced from the substrate by a thin, high quality layer of insulator material acts as the gate or control electrode. A separate conductive layer acts as the anode or electron collector. Electron emission takes place vertically, when a high field is applied between the gate and the cathode under vacuum. The majority of the extracted electrons normally reach the anode, so that the anode current $I_A$ usually exceeds the gate current $I_G$ by a large factor.

The tips are conventionally fabricated by isotropic plasma etching of single-crystal silicon using gases such as $SF_6$, although actual emission may take place from other deposited materials such as diamond-like carbon (Lee et al. 1997; Huq 1998). To obtain a high field, extremely small tip radii and small cathode-gate electrode separations are required. Methods of forming suitable tip radii based on oxidation machining have been developed (Marcus et al. 1990; Liu et al. 1991; Huq et al. 1995). Methods of fabricating closely spaced gates and focusing electrodes have also been developed (U.S. Pat. Nos. 5,266,530; 5,228,877, Itoh et al. 1995). Since the required electrode separation is normally very small, the definition of the electrodes often involves a process that avoids lithography and that has inherent self-alignment.

Less attention has been paid to knife-edge or wedge-shaped emitters, because of the reduction in electric field strength arising from the elimination of one radius of curvature from the emitter tip (Chin et al. 1990). However, knife-edge emitters offer potentially high emission current due to their large emission area. Furthermore, there is considerable flexibility in the choice of cathode material when the emitter is constructed from a deposited thin film, and low work function materials other than silicon may be used.

Knife-edge emitters have been constructed with both horizontal (in-plane) and vertical (out-of-plane) cathodes. In some horizontal structures, an entirely in-plane arrangement of cathode and gate electrodes has been adopted (Hoole et al. 1993; Gotoh et al. 1995). In these cases, the required small electrode separation was obtained by electron-beam lithography (in the first case) and focussed-ion-beam etching (in the second). In another horizontal structure, the gate and cathode electrodes were arranged in a planar stack, as shown in FIG. 2 (Johnson et al. 1997). In this case, the required small electrode separation was obtained using thin deposited insulator layers.

A number of vertical cathode structures have been constructed in silicon. For example, FIG. 3 shows an emitter based on a wedge-shaped silicon cathode (Jones et al. 1992). This structure is conceptually similar to the cylindrical emitter previously shown in FIG. 1. Techniques have been developed to sharpen the tip of the silicon wedge, for example, by oxidation machining (Liu et al. 1991) or by preferential erosion of a surface mask layer (Rakshandehroo et al. 1996).

Similarly, a number of vertical or partially vertical cathode structures have been constructed from metal layers deposited on silicon substrates. The advantage of using a metal layer is that a small tip radius can be achieved without special processing, since the maximum tip radius cannot exceed half the thickness of the metal layer. For example, FIG. 4 shows a petal-shaped field emitter, in which the metal layer is deposited through a self-aligned circular mask onto the sloping walls of a pyramid-shaped pit formed by anisotropic etching of silicon (Gamo et al 1995). A number of related devices known as volcano emitters have been described (Wang et al. 1996; Lee et al. 1997).

FIG. 5 shows a volcano emitter based on a vertical wall formed in a thin layer of silicon carbide (Busta 1997; U.S. Pat. No. 6,008,064). The exposed vertical tip is obtained by conformally depositing thin layers of silicon dioxide, silicon carbide and a metal on an etched silicon mesa (step 1), and then using chemical mechanical polishing (CMP) to remove the layers from the upper surface of the mesa (step 2). The silicon dioxide is then recessed by wet chemical etching to improve the electrical isolation (step 3). In this case, the silicon substrate acts as the gate, the silicon dioxide as the insulator and the silicon carbide as the cathode.

The principle of material deposition over an etched substrate has been used as a method of fabricating vertical-wall emitters by many others, particularly Hsu and Gray (Hsu et al.1992; Hsu et al.1996; U.S. Pat. Nos. 4,964,946; 5,214,347; 5,266,155; 5,584,740; 6,084,245; 6,168,491; 6,246,069).

For example, FIG. 6 shows the formation of a vertical metal wall by depositing a single layer of metal over a cylindrical etched mesa (steps 1 and 2). The metal film is then removed from the upper surface of the mesa by ion bombardment (step 3). In this case, the ion bombardment was continued to remove the entire mesa structure to obtain a free-standing annular vertical metal wall (step 4). Multilayer deposition of metals and insulators may again be used to obtain more complex layered vertical electrode structures. Clearly, the main difference from the work of Busta is the use of ion-beam erosion instead of chemical mechanical polishing, which cannot easily form such free-standing structures.

Fleming has devised an entirely different field-emission device containing both vertical and horizontal metal electrodes (Fleming et al. 1996; U.S. Pat. No. 5,457,355). FIG. 7 shows one process for forming such a structure. Successive layers of silicon dioxide, silicon nitride and titanium nitride are first deposited on a silicon substrate, and a trench is etched through all these layers to the substrate (step 1). Further layers of polysilicon, titanium nitride and silicon dioxide are then deposited over the trench (step 2). The silicon dioxide is then etched in a reactive plasma, whose action is stopped at the TiN layer (step 3).

The exposed, upper layer of TiN is then etched in a wet acid etch, so that the horizontal upper TiN layer is removed and the vertical TiN layer is slightly recessed (step 4). The exposed polysilicon layer is then removed by extended etching in an isotropic plasma-etch process, for example based on $SF_6$. Finally, the exposed silicon dioxide layer is recessed by wet chemical etching in hydrofluoric acid to improve the electrical isolation (step 5).

In this structure, the vertical TiN layers act as cathodes, and the upper horizontal layer of TiN provides a set of gate electrodes. However, these two electrode types are formed from films deposited by successive and different deposition steps. The only lithographic step used is the process defining the initial etched trench opening. The subsequent electrode alignment and a small electrode separation are achieved through the use of inherently self-aligned processing based on multi-layer deposition over the etched structure followed by selective etching.

SUMMARY OF THE INVENTION

The method is based on the enhancement of material removal rates that are obtained when materials are exposed to a directed ion beam at oblique ion incidence. The enhanced erosion rate allows the preferential removal of a thin layer of a conductor such as a metal at the convex corner of a surface step (or mesa) in a substrate. Removal of the metal layer at the mesa edge can create a well-defined separation between the remaining horizontal and vertical surfaces of the metal. This distance is determined by a number of factors, including the radius of curvature of the mesa edge, the thickness of the metal layer, and the time of exposure to the ion beam.

The remaining horizontal metal surface may be used as the gate and the vertical surface as the cathode in a vacuum triode structure. The anode is a separate electrode. Electrical isolation between the gate and the cathode is obtained by forming the mesa in an insulating substrate, or in an insulating layer formed on a substrate. Isolation may be improved by selectively removing the insulating layer in the vicinity of the metal edges by isotropic etching.

Electron emission from the cathode may be obtained at low voltage and without heating based on the enhancement of the electric field at the sharp tip of the cathode. By using a meander layout for the mesa, the length of this structure may be made large, thus increasing the area available for electron emission. The device has applications as an electron source in field-emission fiat panel displays and in impact ionisation sources for vacuum instruments such as mass spectrometers.

In accordance with a first aspect of the present invention there is provided a method of forming an electrode structure comprising the steps of providing an electrically insulating substrate having an edge defined by two intersecting planes over which is provided a layer of conductive material and selectively removing the conductive material at the edge thereby to form two electrodes.

Preferably, the method further comprises the step of removing a part of the insulating substrate adjacent the edge from which the conductive material has been removed, thereby to enhance the electrical insulation.

The substrate is preferably first etched by a directional process to form a mesa with a small radius of curvature at the junction between its horizontal and vertical surfaces.

The edge preferably comprises the junction of the vertical and horizontal planes of the mesa.

An additional layer of material different from the conductive material is preferably provided at the junction of the vertical plane and the lower horizontal surface of the substrate, which serves to prevent erosion of the conductive layer at that position during ion-beam bombardment.

The conductive material preferably has a low work function so as to improve the efficiency of electron emission when the electrode structure is used as an electrode source.

The edge is preferably in the form of a meander pattern, the total length of which is substantially greater than the perimeter of the region on the surface of the substrate occupied by the electrodes. The meander pattern may comprise a plurality of linear segments.

The conductive material is preferably removed by ion-beam erosion, which preferably involves the bombardment by ions of one of: (a) an unreactive species; (b) a reactive species; and (c) a mixture of the two.

The substrate may comprise an insulating material deposited on a conductor, the insulating material preferably being so deposited after formation of the edge or the mesa in the surface of the substrate.

In accordance with a second aspect of the present invention there is provided an electrode structure formed by the above method, wherein the two electrodes are formed on a region of the surface of the substrate, the two electrodes defining a gap which extends in a meander pattern, the total length of which is substantially greater than the perimeter of the region.

In accordance with a third aspect of the present invention there is provided an electrode structure comprising a pair of electrodes formed on a region of the surface of a substrate, the pair of electrodes defining a gap extending in a meander pattern, the total length of which is substantially greater than the perimeter of the region.

The meander pattern preferably comprises a plurality of linear segments.

The invention extends to a cold-cathode field-emission electron source comprising an electrode structure of the above type, in which the edge comprises the junction of the vertical and horizontal planes of a mesa formed on the substrate and wherein the resulting vertical electrode comprises the cathode of the electron source and the resulting horizontal electrode comprises the gate.

Alternatively, the horizontal electrode may comprise the cathode of the electron source and the vertical electrode may comprise the gate.

The invention extends to a diode, a triode comprising an electrode structure of the above type and finds particular application in a display device or as an ion source, e.g. for use in a mass spectrometer.

Thus, in a preferred embodiment of the present invention, a method is provided for forming vertical knife-edge cold-cathode field emission electron sources with self-aligned gates and sub-micron electrode separations. The aim is to reduce the complexity and cost of such structures, and to increase the range of possible materials that may be used in their construction.

In a preferred embodiment, the method uses a combination of different aspects of the approaches of Fleming and Hsu et al. in the prior art described above. The layout is essentially similar to that of Fleming, since it involves vertical cathodes and horizontal gate electrodes, which are again deposited on an etched structure. The fabrication method also involves the ion beam erosion process of Hsu et al.

However, the process is different from, and advantageous over, the arrangements described in these two prior-art references. First, the vertical cathode and horizontal gate electrodes are formed in the same single metal layer, and the need for complex multi-layer deposition and highly selective etching of the type used by Fleming and shown in FIG. 7 is substantially eliminated.

Secondly, the ion-beam erosion used by Hsu et al. in FIG. 6 to remove a terraced support is used here to form a controllable self-aligned sub-micron electrode separation in this single layer of metal. The process is therefore extremely simple and flexible, and may be readily applied to a wide variety of materials.

The process is based on the inherent angle-dependence of ion-beam milling rates, which are considerably enhanced in many materials for angles of ion incidence near 45° (Somekh 1976; Melliar-Smith 1976). This principle is not exploited in the prior art described above.

BRIEF DESCRIPTION OF THE DRAWINGS

Preferred embodiments of the invention will now be described with reference to the accompanying drawings in which.

DETAILED DESCRIPTION OF THE INVENTION

The basic process will now be described with reference to FIGS. 8 and 9, which illustrate the basic process. A substrate 1 is first dry-etched to form a mesa structure 2 using a patterned hard mask 3 (steps 1 and 2 in FIG. 8). A variety of substrates may be used, including insulating and non-insulating materials. If the substrate is not an insulator, it may be converted into an insulator near the surface by deposition or formation of an insulating layer. For example, a silicon substrate may be used, on which an insulating layer of silica may be formed by thermal oxidation.

A number of materials may be used as a hard mask, e.g. a 2000 Å (200 nm) thick Cr metal layer. A number of methods may be used to carry out the mesa etching, including reactive ion etching (RIE) and reactive ion beam etching (RIBE). For example, an RIE process based on Ar, $O_2$ and $CHF_3$ gases in an Oxford Plasma Technology RIE80 parallel plate etcher may be used. The depth of the mesa feature should be large compared with the radius of curvature of the convex mesa edge, for example, a mesa etch depth of 1.5 $\mu$m, which is large compared to the sub-micron radius of curvature of the mesa edge.

Figure 9:
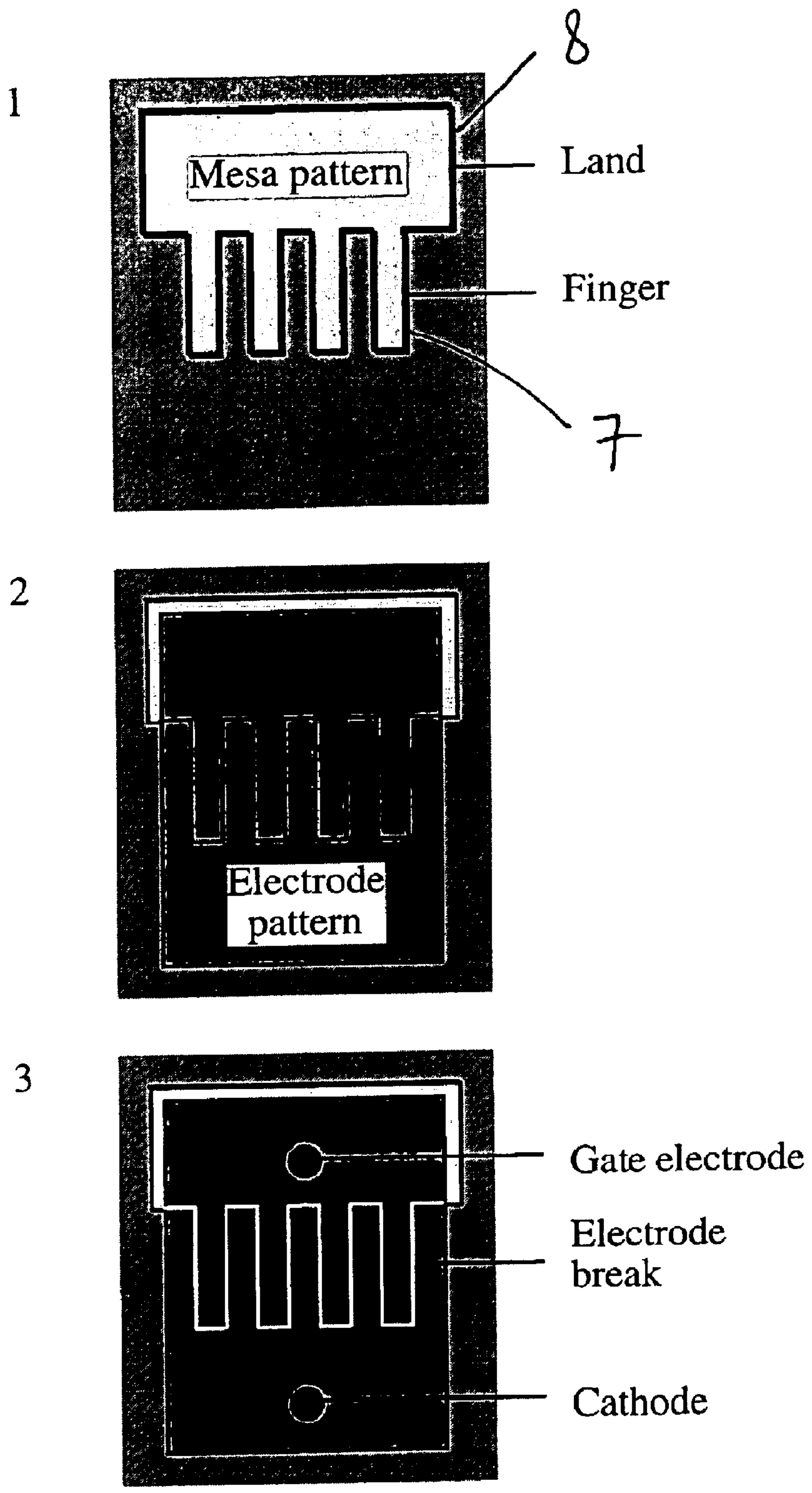
FIG. 9 illustrates a layout of knife-edge cold-cathode vertical field emission electron source with a meander electrode pattern in accordance with a preferred embodiment of the present invention.

The mesa structure consists of a set of fingers 7 attached to a land 8, so that the perimeter of the mesa 2 forms a meander layout (step 1 in FIG. 9). The area that will be available for the emission of electrons is defined by the perimeter of the mesa. A large emission area may be obtained from a meander layout that consists of a set of long, thin, parallel fingers that are arranged in close proximity to one another. However, other meander layouts may also be suitable and this layout is not exclusively required. A variety of finger lengths and widths may be used. The present applicants have successfully used finger widths and separations between 2 $\mu$m and 5 $\mu$m. The hard mask 3 is removed when mesa etching has been completed.

Figure 1:
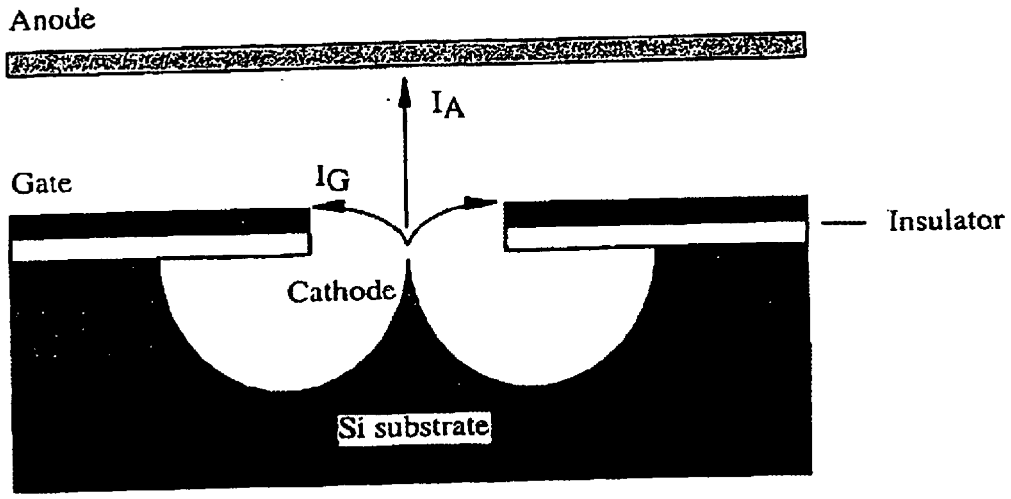
PRIOR ART Figure 1
FIG. 1 illustrates a prior-art silicon-based cold-cathode field emission electron source based on a sharp tip formed by isotropic etching.
Figure 2:
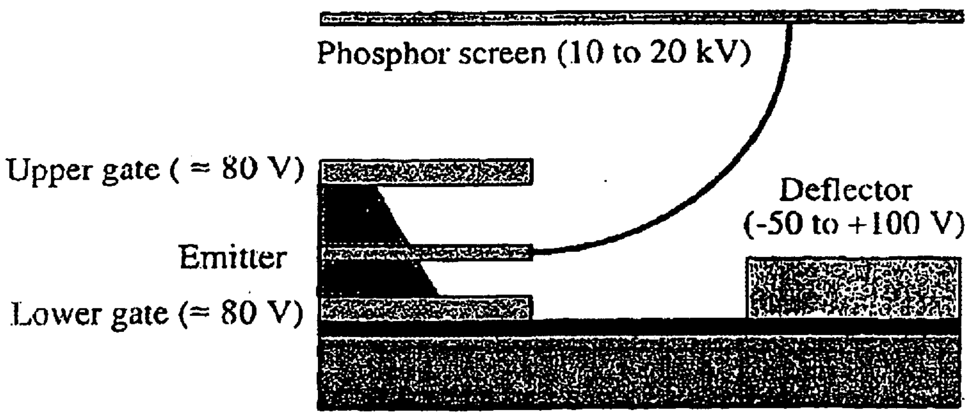
PRIOR ART Figure 2
FIG. 2 illustrates a prior-art horizontal metal edge emitter described by Johnson et al. (1997)
Figure 3:
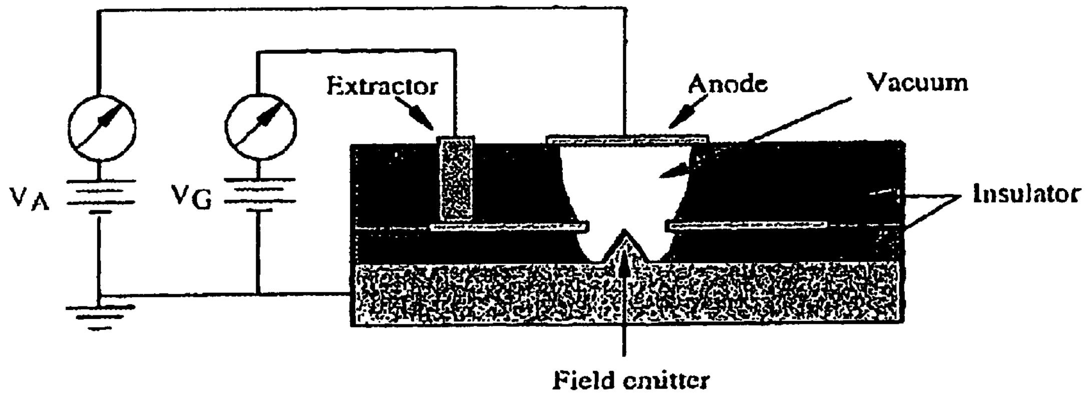
PRIOR ART Figure 3
FIG. 3 illustrates a prior-art vertical silicon edge emitter described by Jones et al. (1992)
Figure 4:
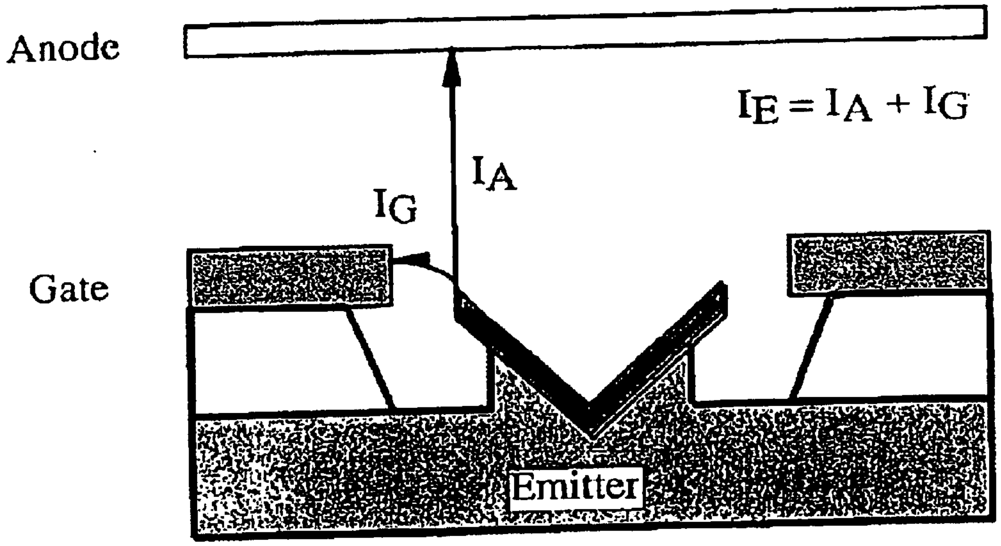
PRIOR ART Figure 4
FIG. 4 illustrates a prior-art petal-shaped metal edge emitter described by Gamo et al. (1995)
Figure 5:
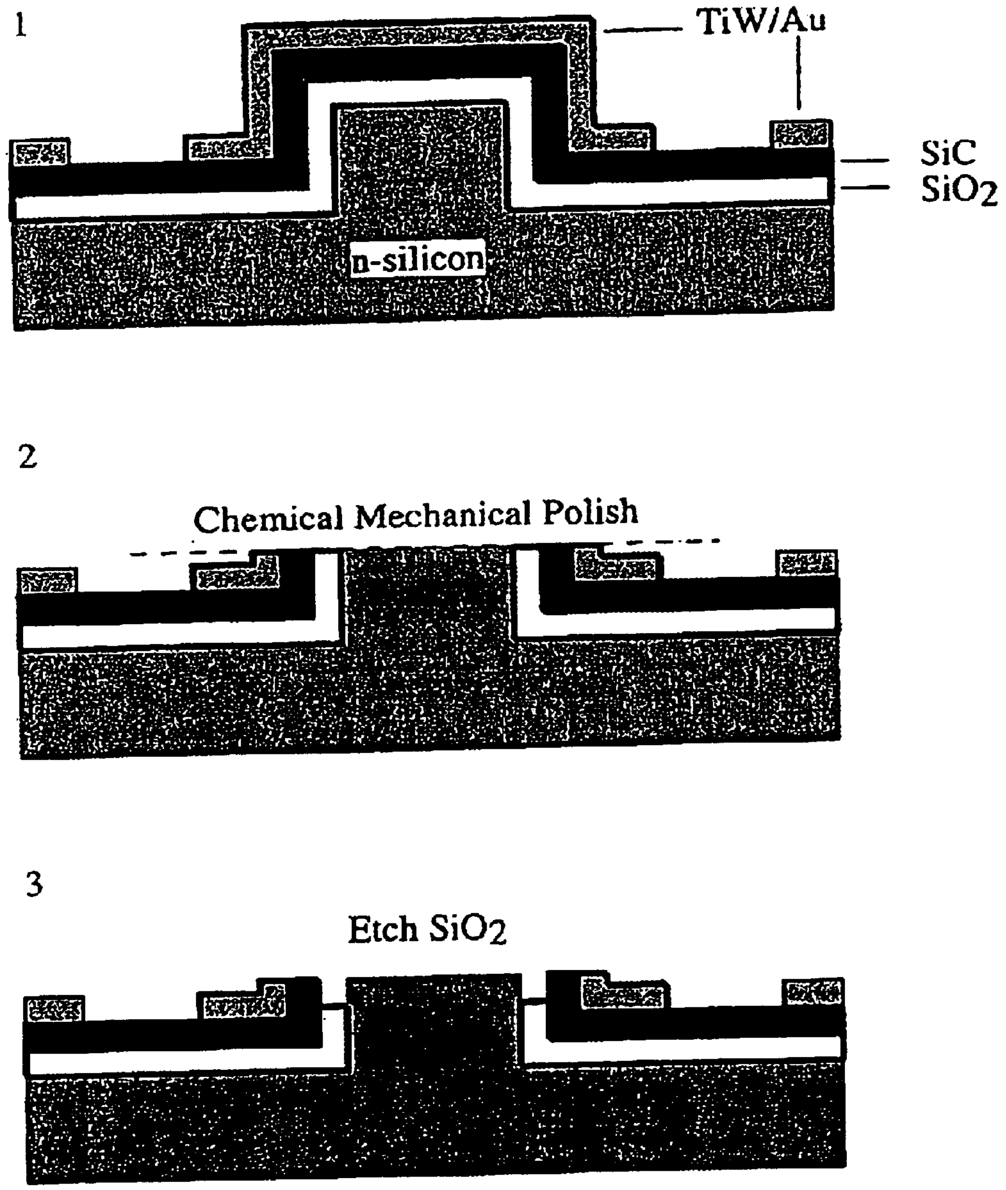
PRIOR ART Figure 5
FIG. 5 illustrates a prior-art method of forming a vertical SiC edge emitter described by Busta (1997)
Figure 6:
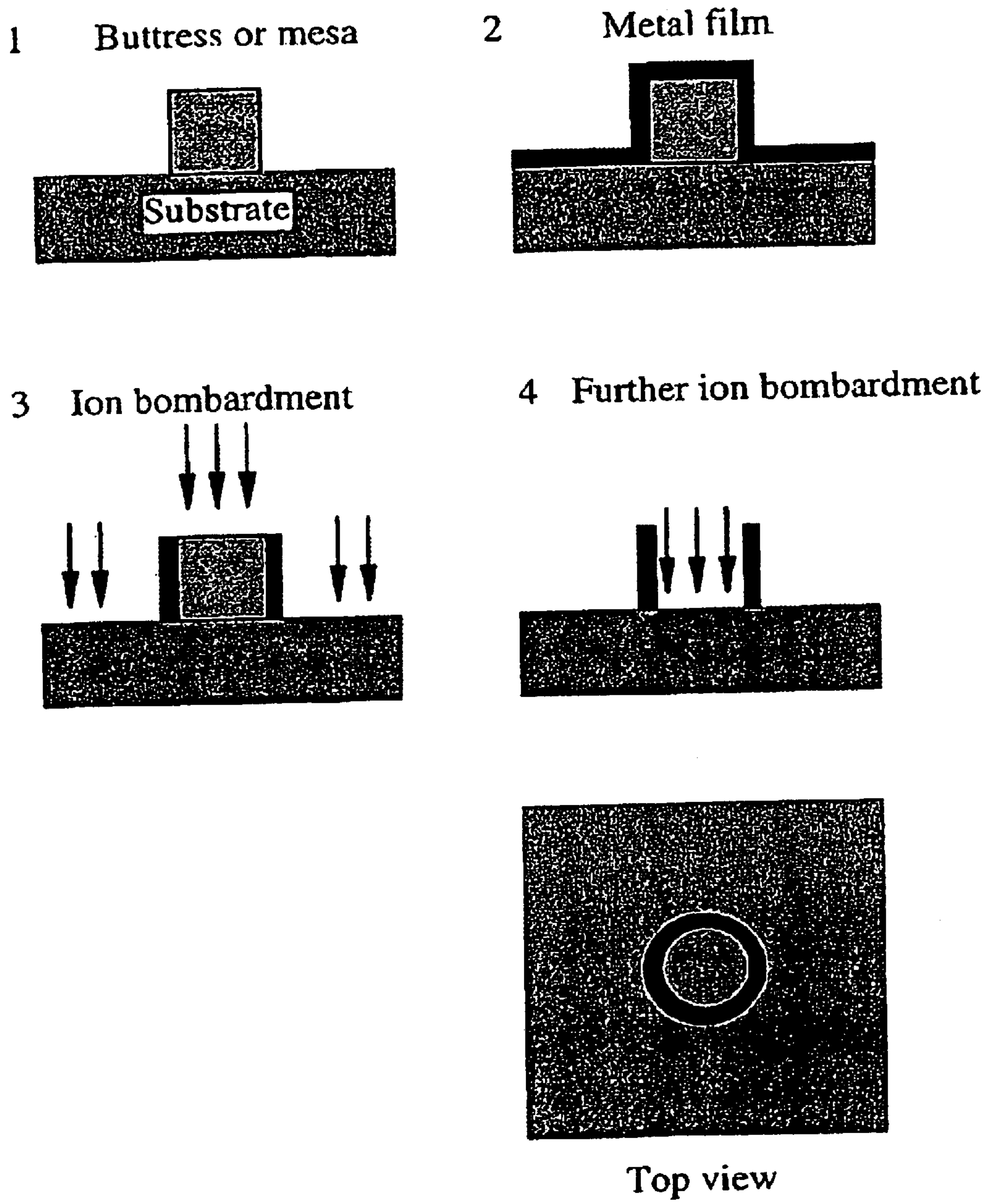
PRIOR ART Figure 6
FIG. 6 illustrates a prior-art method of forming a vertical metal edge emitter described by Hsu et al. (1992)
Figure 7:
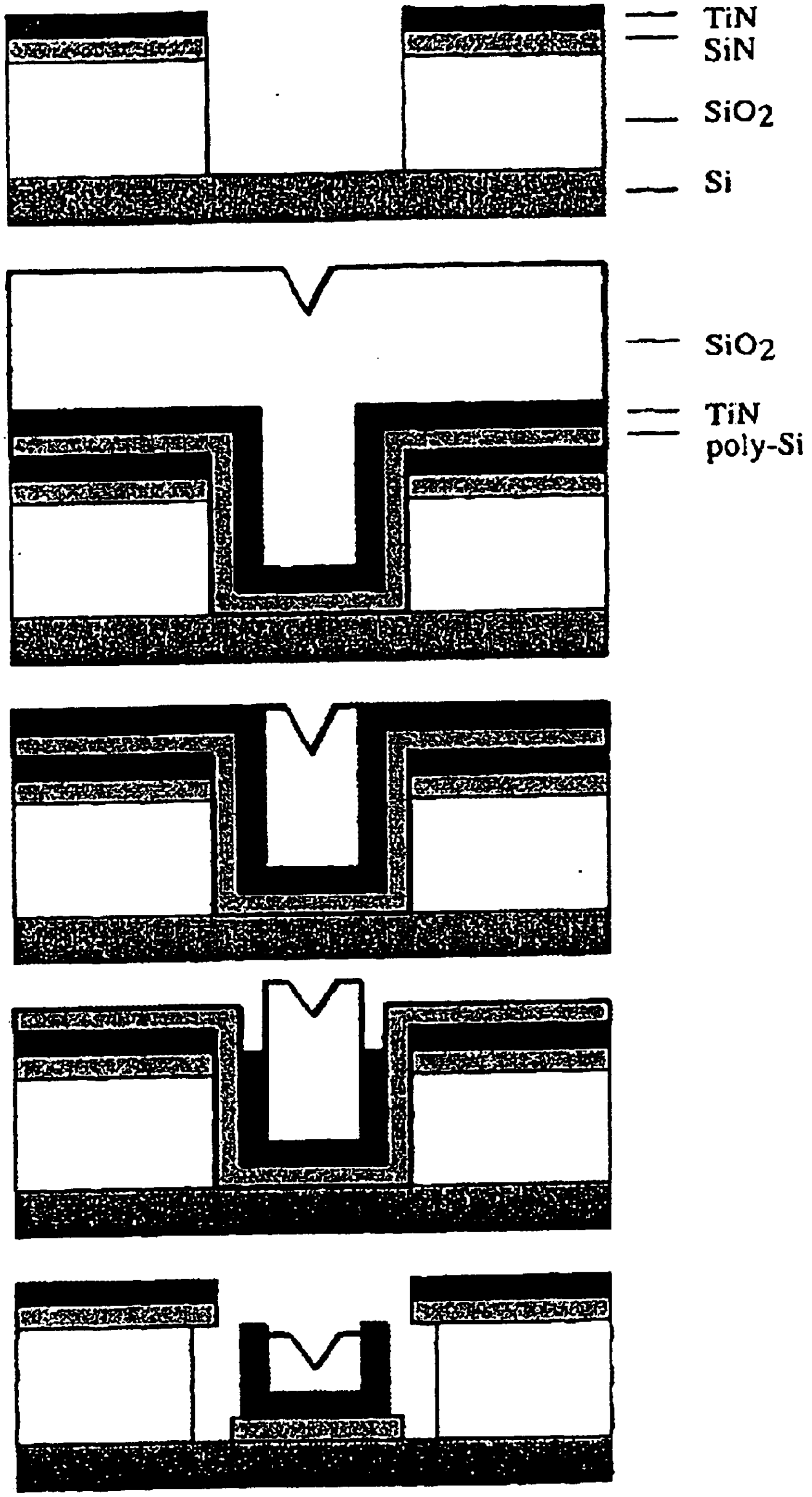
PRIOR ART Figure 7
FIG. 7 illustrates a prior-art method of forming a vertical metal edge emitter described by Fleming et al. (1996)
Figure 8:
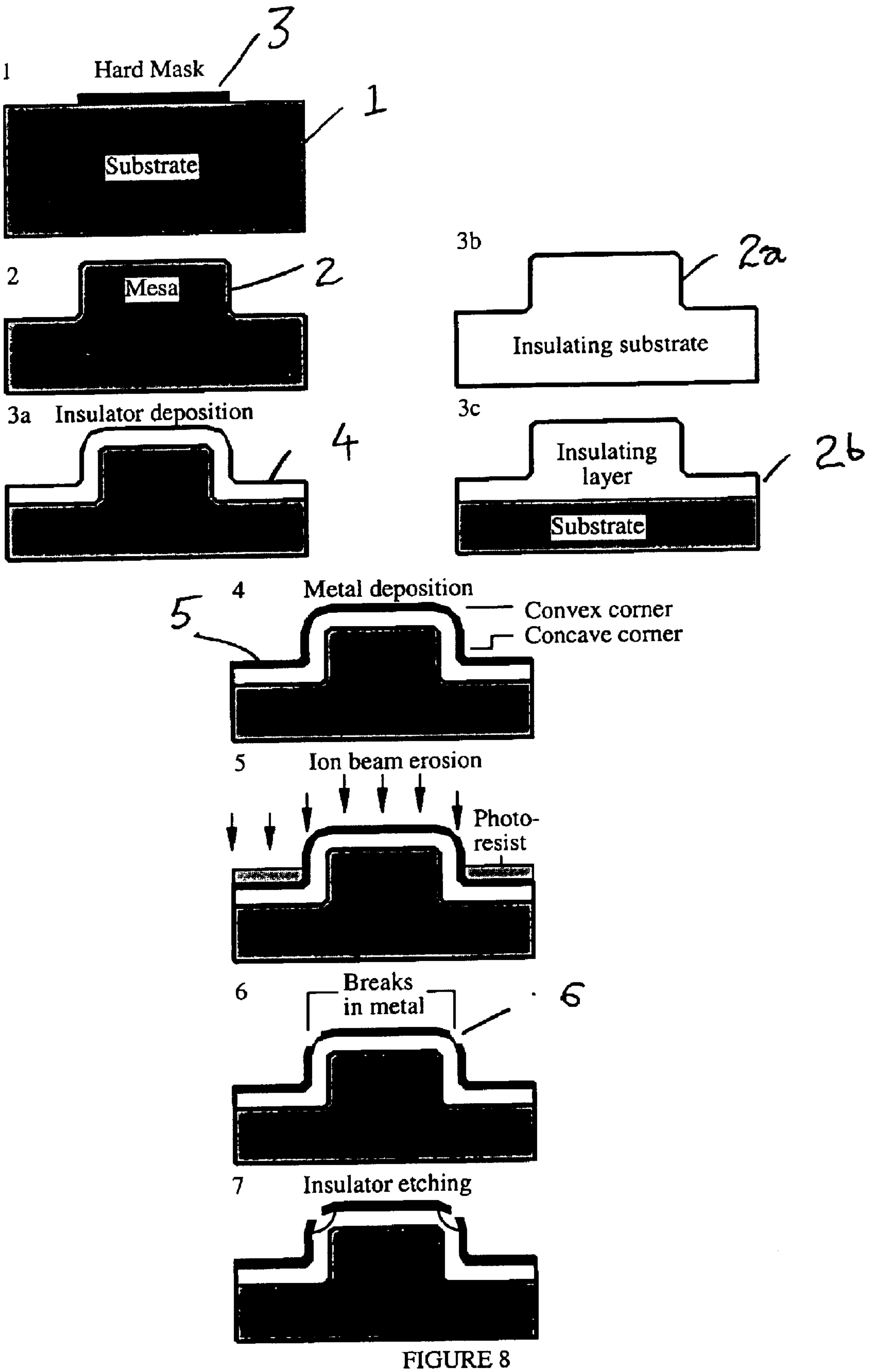
FIG. 8 illustrates a schematic arrangement of a process, in accordance with a preferred embodiment of the present invention, for forming a knife-edge cold-cathode vertical field emission electron source by selective erosion of a metal layer.

If the substrate is conductive, the structure is then coated in an insulating layer 4 (step 3*a* in FIG. 8). Several different processes may be used to form this layer. For example, dry thermal oxidation may be used to form a 0.5 $\mu$m thick layer of high-quality silicon dioxide. This process also rounds the convex corners of the mesa in a controllable manner.

At this point, the overall structure consists of a patterned mesa 2 formed at least partially in an insulating material 4. Similar starting structures may be formed in entirely insulating substrates 2*a* (step 3*b* in FIG. 8) or in insulating layers deposited on conducting substrates 2*b* (step 3*c* in FIG. 8). The remainder of the process is similar for each of the three alternatives 3*a*, 3*b* and 3*c* in FIG. 8.

The structure is then conformally coated with a thin layer of cathode material 5 (step 4 in FIG. 8). There is a wide range of potentially suitable materials, for example including but not restricted to W. In this demonstration, 500 Å (50 nm) of Cr metal is used, which is deposited by sputtering. The metal is then patterned by a coarse lithography step, which does not form the narrow electrode break, but which restricts the metal to lie inside the mesa except near the fingers (step 2 in FIG. 9).

Figure 10:
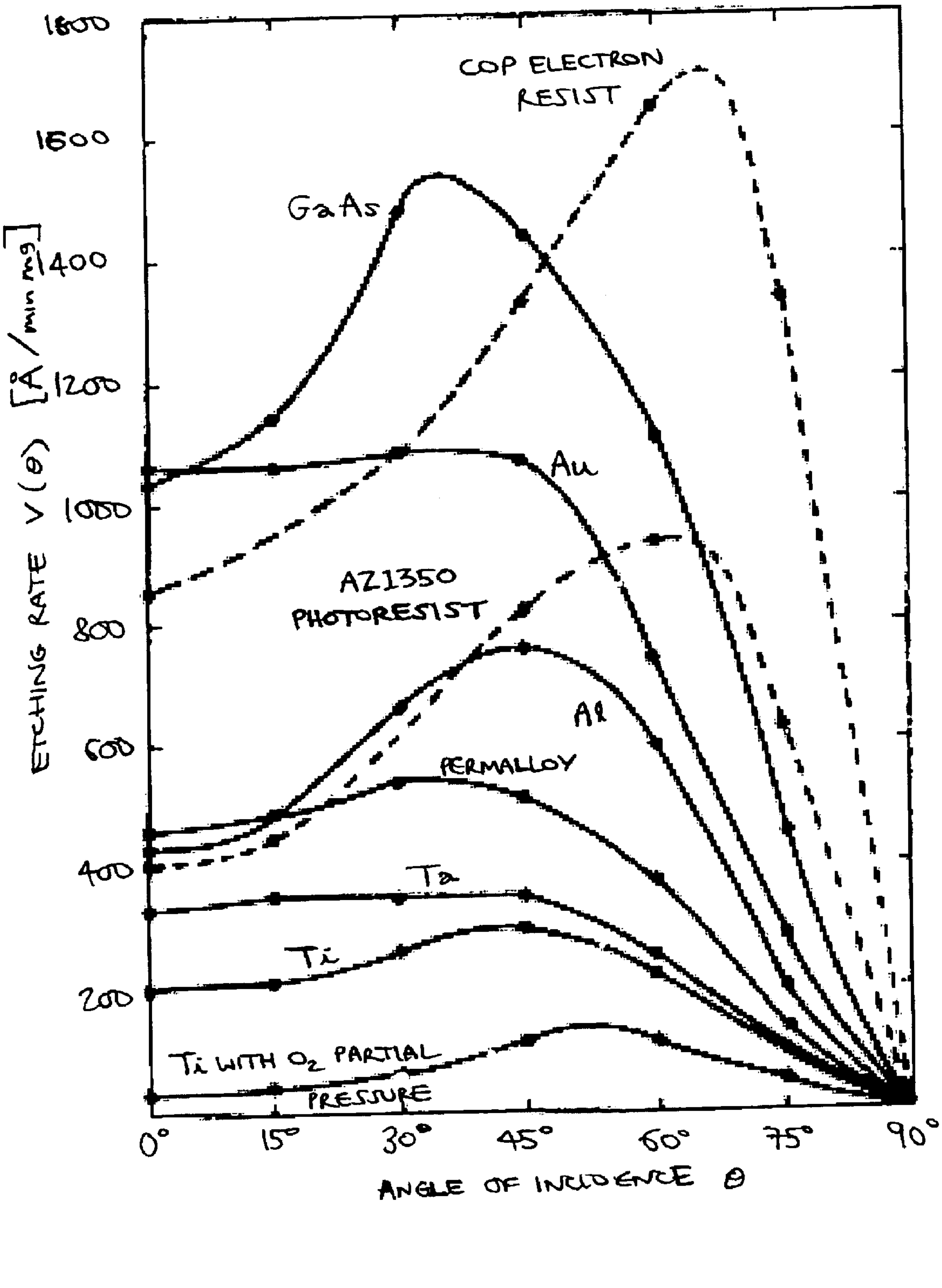
FIG. 10 is a graph illustrating the variation of ion-beam etching rate with respect to the angle of incidence for several different materials and resists, taken from Somekh (1976)

The electrode break 6 is made by another ion beam etching step (step 5 in FIG. 8). As discussed earlier, the operation of this step is based on the angle-dependence of ion beam erosion rates, which are enhanced in many materials for angles of ion incidence near 45°. For example, FIG. 10 shows data for the variation of ion beam milling rate with angle of incidence, for various materials (Somekh 1976). Several of these materials show enhanced erosion rates at oblique incidence.

Oblique angles exist at both the top and at the bottom corners of the mesa structure 2. To avoid erosion of the concave corners at the base of the mesa 2, the base is coated with a layer of material having a thickness sufficient to withstand the ion-beam erosion. A layer of photo-resist may be used, which is spin-coated over the entire mesa and exposed and developed to remove its upper surface.

Figure 11:
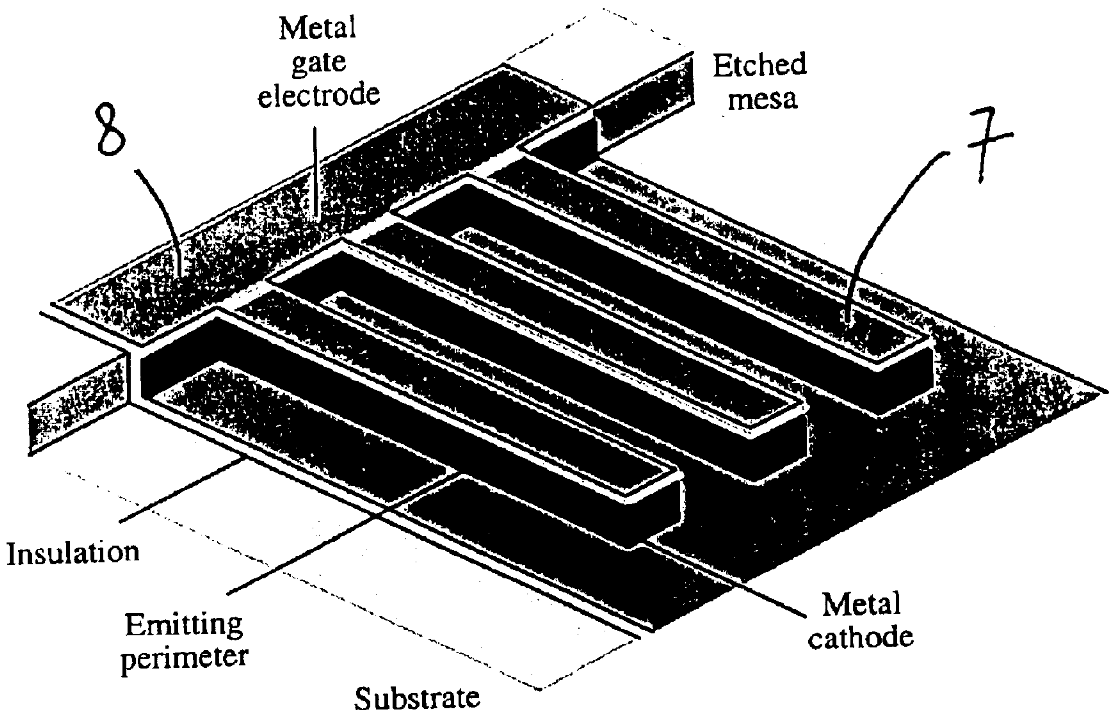
FIG. 11 is a perspective view of a knife-edge cold-cathode vertical field emission electron source with a meander electrode pattern in accordance with a preferred embodiment of the present invention.

Uniform ion-beam etching then forms a break 6 in the metal film at the upper convex corners of the etched mesas only (step 6 in FIG. 8). This break 6 follows the perimeter of the meandered finger pattern 7 in a self-aligned manner, avoiding the need for precise alignment and lithography (step 3 in FIG. 9). The metal layer remaining on the upper surface of the mesa fingers 7 may then be used as a horizontal gate in a vacuum triode type device and the metal on the side-walls of the fingers 7 as a vertical cathode (FIG. 11).

A number of methods may be used to carry out the metal etching, including sputter etching, ion-beam milling, (IBM) reactive ion etching (RIE) and reactive ion-beam etching (RIBE). For example, the present applicants have verified that selective erosion of the metal at the convex corner of a mesa may occur in an RIE process based on Ar, $O_2$ and $CHF_3$ gases, so that etching takes place by a mixture of chemical and physical processes. However, low pressure and a high Ar content were used to enhance the physical etch rate. The present applicants have also verified that the same behaviour occurs in an RIE process based on Ar gas alone, so that etching takes place by entirely physical ion bombardment.

Figure 12:
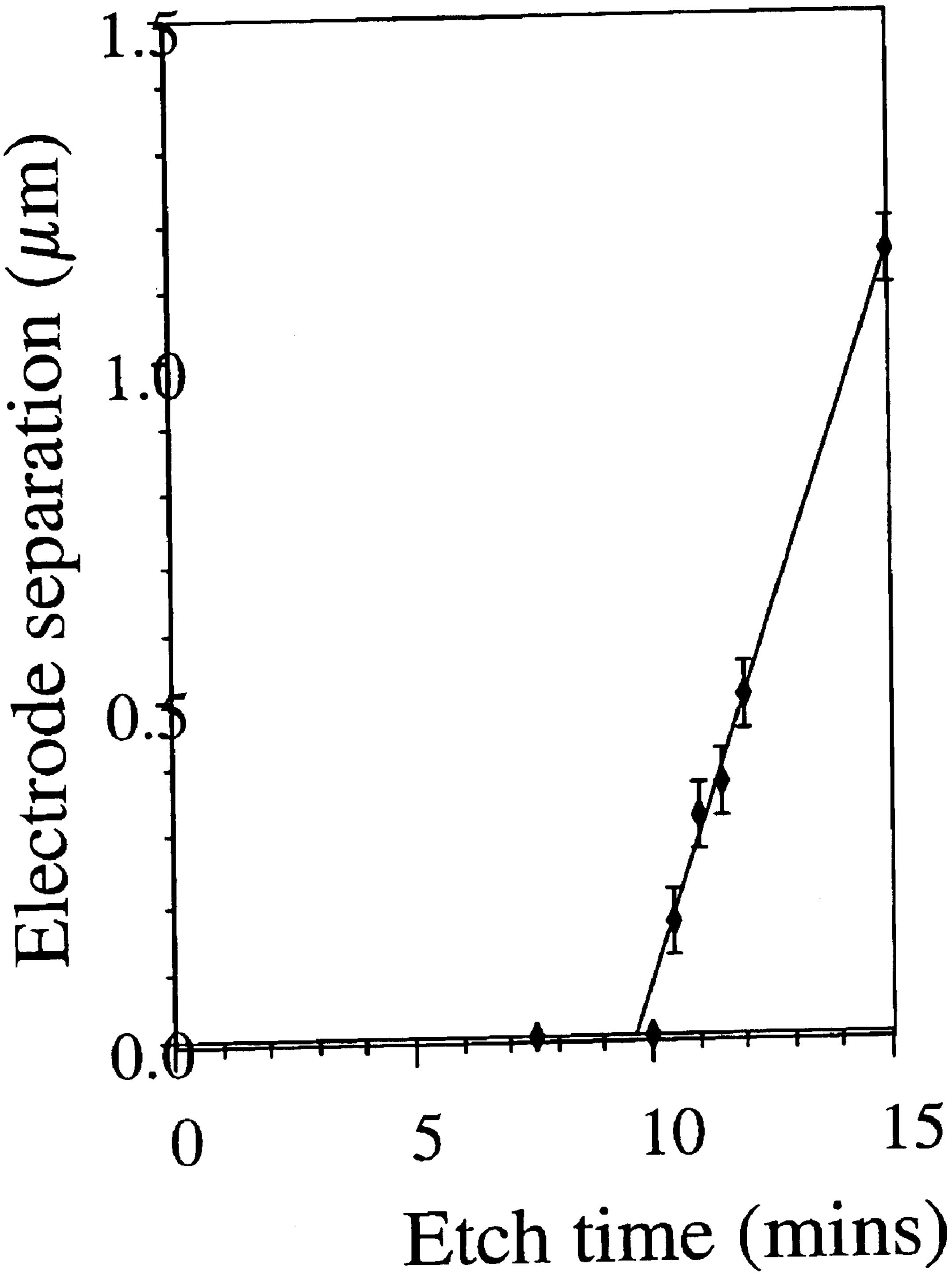
FIG. 12 is a graph illustrating the variation of electrode separation with etching time in an experimental demonstration of a preferred method.

The electrode separation depends strongly on the etch time. Initially, the metal layer is simply thinned on the curved upper corners of the mesa. When the thickness of the metal is reduced locally to zero, a break exists. After the break has been formed, the tip of the vertical knife-edge is eroded rapidly, since it also presents a range of angles to the ion beam. FIG. 12 shows the approximate variation of the electrode separation with etching time obtained in our experiments. No break is formed until around 10 minutes, and separations of up to 0.3 $\mu$m are formed in the next minute of etching. Sub-micron electrode separations may be routinely achieved.

The initial formation of the break in the metal film may be determined by measuring an increase in electrical resistance between the electrodes. This procedure avoids the requirement for microscopic inspection of the etched structure during the fabrication process.

The protective layer at the base of the mesa is then removed. An isotropic etch is then used to remove the insulating layer in the vicinity of the electrode gap, improving the electrical isolation and leaving the gate and cathode edges free-standing (step 7 in FIG. 8). A number of methods of etching exist, including both wet and dry isotropic etching. For example, the present applicants have used isotropic wet chemical etching in buffered hydrofluoric acid to remove a silicon dioxide insulating layer.

Figure 13:
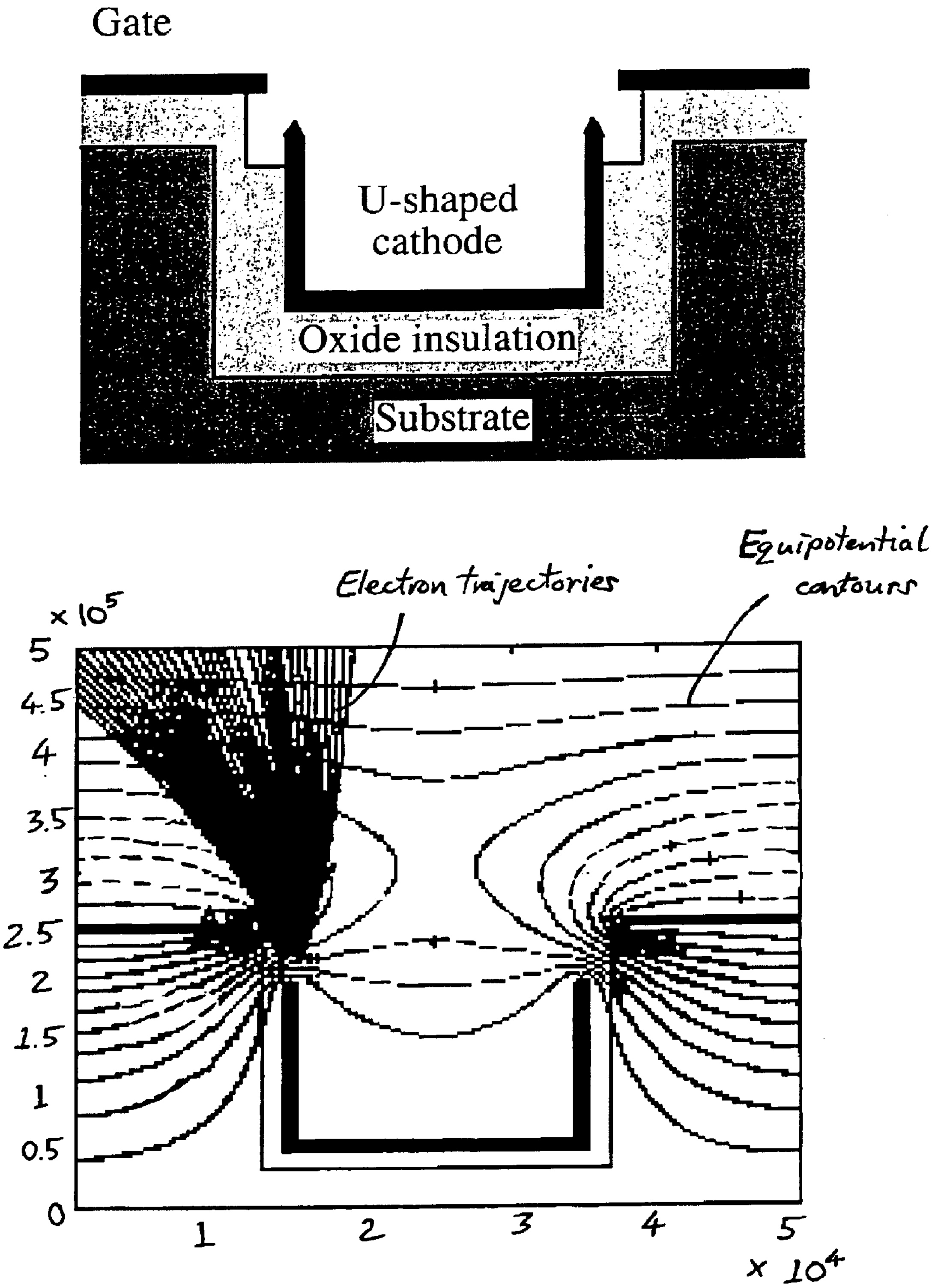
FIG. 13 illustrates a model simulation of equipotential contours and electron emission trajectories from a knife-edge cold-cathode vertical field emission electron source constituting a preferred embodiment of the present invention.

After completion of processing, the cross-section of the device is substantially as shown in FIG. 13. A simulation of the electric potential distribution with example voltages applied to the cathode, gate and distant anode shows a concentration of the electric field near the exposed upper edge of the vertical cathodes. This field enhancement can lead to an unfocussed emission of electrons by field-enhanced tunnelling.

The applicants have prepared a completed device which has a sub-micron electrode gap along the whole of the desired perimeter. Some variation in the gap width was observed to occur between (for example) the outer electrode fingers and the inner ones, and between the electrode fingers themselves and the mesa land. However, the gap was found to be extremely uniform and at its narrowest along the length of the inner fingers. It is likely, however, that this lack of uniformity could be reduced by improved lithographic definition of the original hard mask, and by improved dry etching of the original silicon mesa.

The underlying structure of the device was revealed by light etching in buffered hydrofluoric acid, so that the 0.5 $\mu$m thick silicon dioxide layer could be distinguished from the underlying silicon mesa. The electrode gap was approximately 0.25 $\mu$m. A small amount of sharpening of the 500 Å (50 nm) thick vertical metal edges had taken place, leading to a tip radius of approximately 125 Å (12.5 nm). The metal film had not been distorted noticeably by the isotropic undercut etch.

There is considerable scope for further development using (for example) different substrates, deposited metals and ion beam etch processes. In the simplest case, only two different materials (an insulating substrate, such as but not restricted to silicon dioxide, and a metal layer, such as but not restricted to tungsten) are required in the final structure.

The process can provide a simple method of providing a large emitting perimeter in an arrangement suitable for vertical knife-edge cold-cathode field emission electron sources. Applications for such sources include field-emission flat panel displays and in impact ionisation sources for vacuum instruments such as mass spectrometers.

Since the electron emission does not take place from the substrate material, the structure is particularly though not exclusively appropriate for applications in which the cathode must be insulated from the substrate, and for applications in which silicon may be unsuitable as a substrate or emitter material.

I claim:

1. A method of forming an electrode structure comprising the steps of providing an electrically insulating substrate, the substrate having being etched by a directional process to form a mesa having an edge defined by two intersecting planes at an upper convex corner of the mesa over which is provided a layer of conductive material and selectively removing the conductive material at the edge thereby to form two electrodes, a first electrode formed in a horizontal plane of the mesa and a second electrode formed in a vertical plane of the mesa, both electrodes being formed in the same layer of conductive material, and wherein the removal of the material is effected at the edge only and in a single step.

2. A method as claimed in claim 1, further comprising the step of removing a part of the insulating substrate adjacent the edge from which the conductive material has been removed, thereby to enhance the electrical insulation.

3. A method as claimed in claim 1, wherein the mesa is formed with a small radius of curvature at the junction between its horizontal and vertical surfaces.

4. A method as claimed in claim 1, further comprising the step of providing an additional layer of a material different from the conductive material at the junction of the vertical plane and the lower horizontal surface of the substrate, which serves to prevent erosion of the conductive layer at that position during ion-beam bombardment.

5. A method as claimed in claim 1, wherein the conductive material has a low work function suitable for electron emission.

6. A method as claimed in claim 1, wherein the electrodes are formed on a region of the surface of the substrate and wherein the edge is in the form of a meander pattern, the total length of which is substantially greater than the perimeter of the region.

7. A method as claimed in claim 6, wherein the meander pattern comprises a plurality of linear segments.

8. A method as claimed in claim 1, wherein the conductive material is removed by ion-beam erosion.

9. A method as claimed in claim 8, wherein the ion-beam erosion comprises bombardment by ions of one of: (a) an unreactive species; (b) a reactive species; and (c) a mixture of the two.

10. A method as claimed in claim 1, wherein the substrate includes a first component formed of a conductive material and a second component formed of an insulating material, the insulating material being deposited on the conductive material.

11. A method as claimed in claim 10, wherein the insulating material is so deposited after formation of the edge of the mesa in the surface of the substrate.

12. An electrode structure formed by a method as claimed in claim 1, wherein the two electrodes are formed on a region of the surface of the substrate, the two electrodes defining a gap which extends in a meander pattern, the total length of which is substantially greater than the perimeter of the region.

13. A cold-cathode field-emission electron source comprising an electrode structure as claimed in claim 12, wherein the edge comprises the junction of the vertical and horizontal planes of a mesa formed on the substrate and wherein the resulting vertical electrode comprises the cathode of the electron source and the resulting horizontal electrode comprises the gate.

14. A cold-cathode field-emission electron source comprising an electrode structure as claimed in claim 12, wherein the edge comprises the junction of the vertical and horizontal planes of a mesa formed on the substrate and wherein the resulting horizontal electrode comprises the cathode of the electron source and the resulting vertical electrode comprises the gate.

15. A diode comprising an electrode structure as claimed in claim 12.

16. A triode comprising an electrode structure as claimed in claim 12.

17. An ion source comprising an electrode structure as claimed in claim 12.

18. A mass spectrometer including an electrode structure as claimed in claim 12.

19. A display device comprising an electrode structure as claimed in claim 12.

* * * * *